US005699023A

United States Patent [19]
Tanaka et al.

[11] Patent Number: 5,699,023
[45] Date of Patent: Dec. 16, 1997

[54] HIGH-FREQUENCY SWITCH

[75] Inventors: Koji Tanaka, Yasu-gun; Norio Nakajima, Takatsuki; Mitsuhide Kato, Yasu-gun, all of Japan

[73] Assignee: Murata Manufacturing Co., Ltd., Japan

[21] Appl. No.: 685,462

[22] Filed: Jul. 24, 1996

[30] Foreign Application Priority Data

Jul. 24, 1995 [JP] Japan ................................. 7-187278
Aug. 18, 1995 [JP] Japan ................................. 7-210717

[51] Int. Cl.[6] ............................................. H01P 1/15
[52] U.S. Cl. ................................. 333/103; 333/104; 455/78
[58] Field of Search .............................. 333/101, 103, 333/104; 455/78, 80, 82, 83

[56] References Cited

U.S. PATENT DOCUMENTS

| | | | |
|---|---|---|---|
| 5,159,296 | 10/1992 | Nelson | 333/103 |
| 5,510,757 | 4/1996 | Kumar et al. | 333/104 |
| 5,519,364 | 5/1996 | Kato et al. | 333/103 |
| 5,594,394 | 1/1997 | Sasaki et al. | 333/103 |

*Primary Examiner*—Paul Gensler
*Attorney, Agent, or Firm*—Ostrolenk, Faber, Gerb & Soffen, LLP

[57] ABSTRACT

A high-frequency switch includes first to third high-frequency switch circuits. The first high-frequency switch circuit has a first transmission line connected between a first antenna port and a first receiving circuit port, and a first diode connected between said first receiving circuit port and ground. The second high-frequency switch circuit has a third transmission line connected between a second antenna port and a second receiving circuit port, and a second diode connected between said second receiving circuit port and ground. The third high-frequency switch circuit has a third diode connected between the first antenna port and a transmitting circuit port, and a fourth diode connected between the second antenna port and the transmitting circuit port. With this configuration, ports are connected or disconnected, or connections are switched, by setting the first to fourth diodes to the on state or the off state.

5 Claims, 3 Drawing Sheets

HIGH-FREQUENCY SWITCH

BACKGROUND OF THE INVENTION

1. Field of the Invention

The present invention relates to high-frequency switches for switching signal paths in a high-frequency circuit for use in, for example, a portable telephone, and more particularly, to a high-frequency switch having five ports and including diodes and transmission lines.

2. Description of the Related Art

Some portable telephones use an after-detection diversity method in order to reduce quality degradation of a received wave caused by fading. In the after-detection diversity method, a signal is received in a receiving circuit with a plurality of antennas being switched. When fading in a received wave from one antenna becomes large, the receiving circuit is switched to another antenna and receiving is performed. With this configuration, effects of fading are reduced by switching the antenna.

As a switch used for switching the antenna in the after-detection diversity method, a switch circuit shown in FIG. 4, for example, has been used.

The switch circuit 51 shown in FIG. 4 has three connected three-port switches 52 to 54. The switch 52 includes a first port P21, a second port P22, and a third port P23. In the same way, the switches 53 and 54 include first to third ports, P31, P32, P33, P41, P42, and P43, respectively. The first port P21 of the switch 52 is connected to a receiving section Rx1 and the second port P22 is connected to an antenna ANT1. The switch 52 is configured such that the second port P22 can be connected to the first port P21 or the third port P23, and the third port P23 is connected to the first port P41 of the switch 54.

The switch 53 is configured such that the second port P32 can be connected to the first port P31 or the third port P33. The first port P31 is connected to a receiving section Rx2, the second port P32 is connected to an antenna ANT2, and the third port P33 is connected to the third port P43 of the switch 54.

The switch 54 is configured such that the second port P42 can be connected to the first port P41 or the third port P43. The first port P41 is connected to the third port P23 of the switch 52, the second port P42 is connected to a transmitting section Tx, and the third port P43 is connected to the third port P33 of the switch 53.

With this switch circuit 51, the connection between the antenna ANT1 and the receiving circuit Rx1, the connection between the antenna ANT2 and the receiving circuit Rx2, and the connection between the transmitting circuit Tx and the antenna ANT1 or the antenna ANT2 are switched to select one of the two antennas.

PIN-diode switches or GaAs semiconductor switches are generally used for the three-port switches 52, 53, and 54.

In a switch circuit using conventional PIN-diode switches, since many discrete components are used, the circuit is difficult to make compact. Choke coils and wiring of striplines are required on a printed circuit board for the circuit. This requirement also makes it difficult to miniaturize the circuit.

On the other hand, in a switch circuit using conventional GaAs semiconductor switches, a negative power source is required and the number of pins increases. It is difficult to make the circuit compact.

In addition, a matching circuit has to be designed, and three switches are required, increasing the cost.

SUMMARY OF THE INVENTION

Accordingly, it is an object of the present invention to provide a high-frequency switch which can be used for an apparatus such as a portable telephone employing the after-detection diversity method in order to solve the above-described problems.

The foregoing object may be achieved according to the present invention through the provision of a high-frequency switch comprising: first to fifth ports; a first high-frequency switch circuit for opening (activating) and closing (deactivating) the connection between the first port and the third port; a second high-frequency switch circuit for opening and closing the connection between the second port and the fourth port; and a third high-frequency switch circuit for switching between the connection of the third port and the fifth port and the connection of the fourth port and the fifth port. The first high-frequency switch circuit includes a first transmission line connected between the first port and the third port, a first diode connected between the reference-voltage point and the connection point between the first port and the first transmission line, a first control voltage terminal connected to the connection point between the first diode and the reference-voltage point, and a second transmission line connected between the reference-voltage point and the connection point between the third port and the first transmission line. The second high-frequency switch circuit includes a third transmission line connected between the second port and the fourth port, a second diode connected between the reference-voltage point and the connection point between the second port and the third transmission line, a second control voltage terminal connected to the connection point between the second diode and the reference-voltage point, and a fourth transmission line connected between the reference-voltage point and the connection point between the fourth port and the third transmission line.

A third control voltage terminal is connected to a common connection point where one end of the second transmission line of the first high-frequency switch circuit and one end of the fourth transmission line of the second high-frequency switch circuit are connected.

The third high-frequency switch circuit includes third and fourth diodes connected between the third port and the fifth port and between the fourth port and the fifth port in opposite directions to each other with respect to the fifth port, a fifth transmission line connected between the reference-voltage point and the anode of the third diode, a sixth transmission line connected between the reference-voltage point and the anode of the fourth diode, a fourth control voltage terminal connected to the connection point between the fifth transmission line and the reference-voltage point, a fifth control voltage terminal connected to the connection point between the sixth transmission line and the reference-voltage point, a seventh transmission line connected between the cathode of the third diode and the reference-voltage point, an eighth transmission line connected between the cathode of the fourth diode and the reference-voltage point, a sixth control voltage terminal connected to the connection point between the seventh transmission line and the reference-voltage point, and a seventh control voltage terminal connected to the connection point between the eighth transmission line and the reference-voltage point.

According to the above-described high-frequency switch, since at least three terminals among the first to seventh control voltage terminals are set to the ground voltage, it is only required to supply one polarity of voltage, a positive or a negative voltage. Therefore, circuit patterns for supplying voltages can be simplified, and thereby a printed circuit board on which the high-frequency switch is mounted can be made compact.

Between one pair of connected ports, there exists one of the first and third transmission lines, and one of the third and fourth diodes. Therefore, a high-frequency signal flows through one of the first and third transmission lines and one of the third and fourth diodes, reducing insertion loss.

Since the first to eighth transmission lines form current paths to conduct control currents through the first to fourth diodes, and also increase the impedance of the transmission lines viewed from the connection points, insertion loss and reflection loss can be reduced.

Since the first to third high-frequency switch circuits are integrated into one chip, three switching operations can be performed by one high-frequency switch, and the number of components can be reduced. Therefore, the high-frequency switch can be made compact and inexpensive.

Since the voltages applied to the first to third control voltage terminals are used for controlling the opening and closing of the first and second high-frequency switch circuits, the first port and the third port, and the second port and the fourth port can be connected at the same time.

In the high-frequency switch, at least one of the first to seventh control voltage terminals may be connected to the corresponding connection point through a first resistor. The first to seventh control voltages and the control currents can be easily adjusted by setting the resistance of the first resistor.

In the high-frequency switch, at least one of the first to fifth ports may be connected to the reference-voltage point through a first capacitor. The characteristic impedance can be compensated for by adjusting the capacitance of the first capacitors, and thereby insertion loss and reflection loss caused by the high-frequency switch can be effectively reduced. In addition, the first to eighth transmission lines can be made short, and thereby the high-frequency switch can be made compact.

In the high-frequency switch, at least one of the first to fourth diodes may be provided with a second resistor connected thereto in parallel. Thus, charges accumulated when the diode is in the off state flow through the resistor immediately when the diode enters the on state. Therefore, the diode smoothly switches from the off state to the on state. In addition, the reverse bias to the diode can be stabilized when the diode is in the off state.

In the high-frequency switch, at least one of the first to fourth diodes may be provided with a ninth transmission line and a second capacitor connected to each other in series and connected in parallel to the diode. A parallel resonant circuit is thereby formed by the capacitor component of the diode, obtained when it is in the off state, and the inductor component of the ninth transmission line. Therefore, by configuring the circuit such that the resonant frequency of this parallel resonant circuit matches the frequency of a high-frequency signal to be transmitted to the high-frequency switch, the impedance of the diode, obtained when it is in the off state, can be increased. As a result, the isolation characteristics of the diode can be improved. In addition, the second capacitor prevents a DC current from bypassing through a circuit portion including the ninth transmission line.

In the high-frequency switch of the present invention, the first and second high-frequency switch circuits connect the first transmission line between the first port and the third port, and the third transmission line between the second port and the fourth port. The anode of the first diode is connected between the first port and the first transmission line and the cathode of the first diode is connected to the reference-voltage point. The anode of the second diode is connected between the second port and the third transmission line and the cathode of the second diode is connected to the reference-voltage point. In the third high-frequency switch circuit, the fifth and sixth diodes are connected between the third port and the fifth port and between the fourth port and the fifth port in opposite directions to each other with respect to the fifth port.

Therefore, when the first to fourth diodes are controlled such that each of them is in the on state or in the off state by applying the specified control voltages to the first to seventh control voltage terminals, the third and fifth ports are connected (first connection state), or the fourth and fifth ports are connected (second connection state), or the connection between the first port and the third port and the connection between the second port and the fourth port are implemented at the same time (third connection state).

In addition, the fifth and sixth transmission lines are connected at one end between the third port and the third diode and between the fourth port and the fourth diode, respectively, and the other ends thereof are connected to the reference-voltage point. The seventh and eighth transmission lines are connected at one end between the fifth port, and the third and fourth diodes, respectively, and the other ends thereof are connected to the reference-voltage point. With this configuration, a high-frequency signal is prevented from leaking to the reference-voltage point from the high-frequency transmission lines between ports.

DETAILED DESCRIPTION OF EMBODIMENTS OF THE INVENTION

Figure 1:
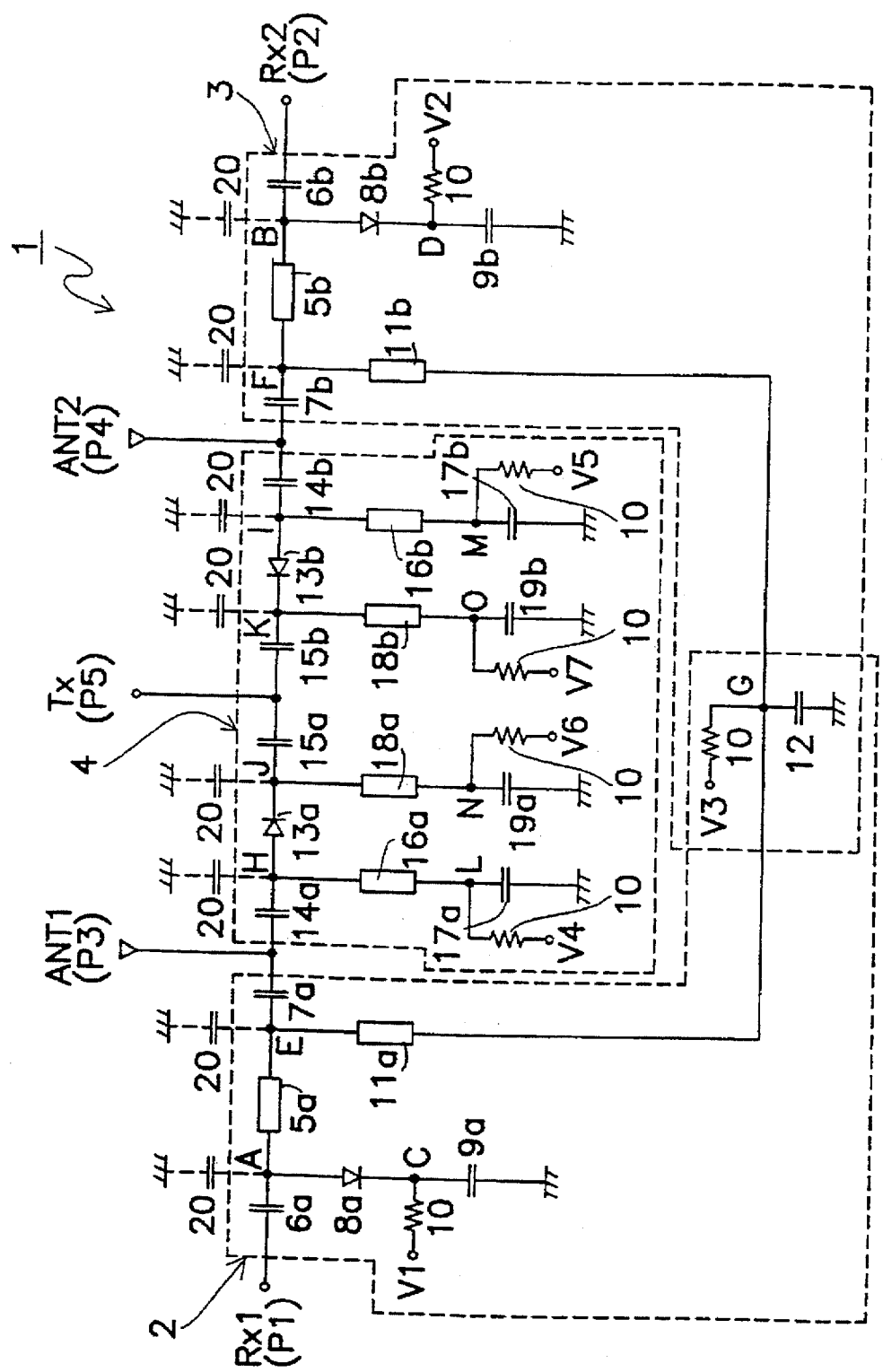
FIG. 1 is a circuit diagram of a high-frequency switch according to an embodiment of the present invention.

An embodiment of the present invention will be described below by referring to the drawings.

FIG. 1 is a circuit diagram of a high-frequency switch according to an embodiment of the present invention. This high-frequency switch has five ports for switching connections between two antennas, two receiving circuits, and one transmitting circuit.

The high-frequency switch 1 has a circuit configuration in which a first high-frequency switch circuit 2 is disposed between a first port P1 which will also be referred to as a first receiving circuit port Rx1 and a third port P3 which will also be referred to as a first antenna port ANT1, a second high-frequency switch circuit 3 is disposed between a second port P2 serving as a second receiving circuit port Rx2 and a fourth port P4 which will also be referred to as a second antenna port ANT2, and a third high-frequency switch circuit 4 is disposed between a fifth port which will also be referred to as a transmitting circuit port Tx, and the first antenna port ANT1 and the second antenna port ANT2. This high-frequency switch 1 may be made on one chip.

In the first high-frequency switch circuit 2, a first transmission line 5a is connected between the first antenna port ANT1 and the first receiving circuit port Rx1. One end of the first transmission line 5a is connected to the first receiving circuit port Rx1 through a capacitor 6a and the other end is connected to the first antenna port ANT1 through a capacitor 7a.

Between connection point A where the first transmission line 5a contacts the capacitor 6a, and the reference-voltage point, that is, the ground, a first diode 8a and a capacitor 9a are connected in series. At connection point C where the first diode 8a contacts the capacitor 9a, a first control voltage terminal V1 is connected through a first resistor 10. One end of a second transmission line 11a is connected to connection point E where the first transmission line 5a contacts the capacitor 7a.

In the second high-frequency switch circuit 3, a third transmission line 5b is connected between the second antenna port ANT2 and the second receiving circuit port Rx2. One end of the third transmission line 5b is connected to the second receiving circuit port Rx2 through a capacitor 6b and the other end is connected to the second antenna port ANT2 through a capacitor 7b.

Between connection point B where the third transmission line 5b contacts the capacitor 6b, and the ground, a second diode 8b and a capacitor 9b are connected in series. At connection point D where the second diode 8b contacts the capacitor 9b, a second control voltage terminal V2 is connected through a first resistor 10. One end of a fourth transmission line 11b is connected to connection point F where the third transmission line 5b contacts the capacitor 7b.

The other ends of the second and the fourth transmission lines 11a and 11b are connected to common connection point G. A third control voltage terminal V3 is connected to the common connection point G through a first resistor 10, and a capacitor 12 is connected between the common connection point G and the ground.

In the third high-frequency switch circuit 4, a third diode 13a is connected between the first antenna port ANT1 and the transmission circuit port Tx, and a fourth diode 13b is connected between the second antenna port ANT2 and the transmission circuit port Tx.

The anode of the third diode 13a is connected to the first antenna port ANT1 through a capacitor 14a, and the cathode of the third diode 13a is connected to the transmission circuit port Tx through a capacitor 15a. The anode of the fourth diode 13b is connected to the second antenna port ANT2 through a capacitor 14b, and the cathode of the fourth diode 13b is connected to the transmission circuit port Tx through a capacitor 15b.

Between connection point H where the third diode 13a contacts the capacitor 14a, and the ground, a fifth transmission line 16a and a capacitor 17a are connected in series. At connection point L where the fifth transmission line 16a contacts the capacitor 17a, a fourth control voltage terminal V4 is connected through a first resistor 10. Between connection point I where the fourth diode 13b contacts the capacitor 14b, and the ground, a sixth transmission line 16b and a capacitor 17b are connected in series. At connection point M where the sixth transmission line 16b contacts the capacitor 17b, a fifth control voltage terminal V5 is connected through a first resistor 10.

Between connection point J where the third diode 13a contacts the capacitor 15a, and the ground, a seventh transmission line 18a and a capacitor 19a are connected in series. At connection point N where the seventh transmission line 18a contacts the capacitor 19a, a sixth control voltage terminal V6 is connected through a first resistor 10. Between connection point K where the fourth diode 13b contacts the capacitor 15b, and the ground, an eighth transmission line 18b and a capacitor 19b are connected in series. At connection point O where the eighth transmission line 18b contacts the capacitor 19b, a seventh control voltage terminal V7 is connected through a first resistor 10.

Assuming that a high-frequency signal flowing through the first to third high-frequency switch circuits 2 to 4 has a wavelength of $\lambda$, the first to eighth transmission lines 5a, 11a, 5b, 11b, 16a, 16b, 18a, and 18b are made up of striplines, microstriplines, and/or coplanar guide lines having lengths of $\lambda/4$ or less. Although the first to eighth transmission lines 5a, 11a, 5b, 11b, 16a, 16b, 18a, and 18b are referred to as $\lambda/4$ lines, they are actually configured with components having lengths of $\lambda/4$ or less due to effects of stripline inductance and stray capacitance.

The operation of the high-frequency switch 1 configured as described above will be described below by referring to a control operation chart shown in Table 1. In Table 1, columns V1 to V7 show the control voltages applied to the control voltage terminals V1 to V7 with + indicating a positive voltage and 0 indicating the ground voltage, column ANT1-Tx shows connection states between the first antenna port ANT1 and the transmission port Tx with x indicating a closed (non-conducting) state and o indicating an open (conducting) state, column ANT2-Tx shows connection states between the second antenna port ANT2 and the transmission port Tx with x indicating a closed state and o indicating an open state, column Rx1-ANT1 shows connection states between the first receiving circuit port Rx1 and the first antenna port ANT1 with x indicating a closed state and o indicating an open state, and column Rx2-ANT2 shows connection states between the second receiving circuit port Rx2 and the second antenna port ANT2 with x indicating a closed state and o indicating an open state.

TABLE 1

| Connect State | V1 | V2 | V3 | V4 | V5 | V6 | V7 | ANT1 -Tx | ANT2 -tX | Rx1- ANT1 | Rx2- ANT2 |
|---|---|---|---|---|---|---|---|---|---|---|---|
| First | + | + | o | + | 0 | 0 | + | o | x | x | x |
| Second | + | + | o | 0 | + | + | 0 | x | o | x | x |
| Third | o | o | + | 0 | 0 | + | + | x | x | o | o |

(1) When transmission is performed only from the first antenna (first connection state)

In the third high-frequency switch circuit 4, a positive power voltage is applied to the fourth and seventh control voltage terminals V4 and V7, and the ground voltage (zero voltage) is applied to the fifth and sixth control voltage terminals V5 and V6. As a result, a forward-direction bias is applied to the third diode 13a to turn it on and a reverse-direction bias is applied to the fourth diode 13b to turn it off.

Therefore, a high-frequency-signal transmission path is formed between the first antenna port ANT1 and the transmission port Tx, and no high-frequency-signal transmission path is formed between the second antenna port ANT2 and the transmission port Tx. Since the impedance of the fifth to eighth transmission lines 16a, 16b, 18a, and 18b viewed from connection points H to K is infinite, a high-frequency signal for transmission is not conducted from the transmission port Tx to the ground from connection points H to K.

In this mode, the first and second receiving circuit ports Rx1 and Rx2 are not connected to the first and second antenna ports ANT1 and ANT2. Therefore, the first and second high-frequency switch circuits 2 and 3 are set such that high-frequency-signal transmission paths are closed. In other words, in the first and second high-frequency switch circuits 2 and 3, a positive voltage is applied to the first and second control voltage terminals V1 and V2, and the ground voltage is applied to the third control voltage terminal V3 to turn off the first and second diodes 8a and 8b.

(2) When transmission is performed only from the second antenna (second connection state)

In this case, the first and second high-frequency switch circuits 2 and 3 operate in the same way as in the first connection state, described above. The operation of only the third high-frequency switch circuit 4 will be described below.

The positive voltage is applied to the fifth and sixth control voltage terminals V5 and V6, and the ground voltage (zero voltage) is applied to the fourth and seventh control voltage terminals V4 and V7. As a result, a forward-direction bias is applied to the fourth diode 13b to turn it on and a reverse-direction bias is applied to the third diode 13a to turn it off.

Therefore, a high-frequency-signal transmission path is formed between the second antenna port ANT2 and the transmission port Tx, and no high-frequency-signal transmission path is formed between the first antenna port ANT1 and the transmission port Tx.

(3) When receiving is performed with the first and second antennas (third connection state)

In the first and second high-frequency switch circuits 2 and 3, the positive voltage is applied to the third control voltage terminal V3, and the ground voltage (zero voltage) is applied to the first and second control voltage terminals V1 and V2. As a result, a forward-direction bias is applied to the first and second diodes 8a and 8b to turn them on at the same time.

Therefore, high-frequency-signal transmission paths are formed at the same time between the first antenna port ANT1 and the receiving circuit port Rx1 and between the second antenna port ANT2 and the receiving circuit port Rx2.

As described above, according to the high-frequency switch 1 of the present invention, since at least three terminals among the first to seventh control voltage terminals V1 to V7 are set to the ground voltage, it is only required to supply one polarity of voltage, a positive or a negative voltage. Therefore, circuit patterns for supplying voltages can be simplified, and thereby a printed circuit board on which the high-frequency switch 1 is mounted can be made compact.

In the first to third connection states described above, between one pair of connected ports, there exists one of the first and third transmission lines 5a and 5b, and one of the third and fourth diodes 13a and 13b. In the first connection state, when a high-frequency signal flows between the third and fifth ports P3 and P5, this high-frequency signal flows through the diode 13a only, reducing insertion loss.

Since the second and fourth to eighth transmission lines 11a, 11b, 16a, 16b, 18a, and 18b form current paths to conduct control currents through the first to fourth diodes 8a, 8b, 13a, and 13b, and also increase the impedance of the transmission lines viewed from connection points E, F, H, I, J, and K, insertion loss and reflection loss can be reduced.

Since the first to third high-frequency switch circuits 2 to 4 may be integrated into one chip, three switching operations can be performed by one high-frequency switch, and the number of components can be reduced. Therefore, the high-frequency switch can be made compact and inexpensive.

Since the voltages applied to the first to third control voltage terminals V1 to V3 are used for controlling the opening and closing of the first and second high-frequency switch circuits 2 and 3, the first port P1 and the third port P3, and the second port P2 and the fourth port P4, can be connected at the same time.

The switch may be configured such that the ground voltage is substituted for the positive voltage and a negative voltage is substituted for the ground voltage. In this case, in the first connection state, the ground voltage, that is, the zero voltage, is applied to the first, second, fourth, and seventh control voltage terminals V1, V2, and V7, and the negative voltage is applied to the third, fifth, and sixth control voltage terminals V3, V5, and V6. The voltages are applied in the same way in the second and third connection states.

The directions in which the first to fourth diodes 8a, 8b, 13a, and 13b are connected are not limited to those shown in FIG. 1. The diodes may be connected in the directions reverse to those shown in FIG. 1. In other words, the first to fourth diodes 8a, 8b, 13a, and 13b may be connected such that the anodes of the first to fourth diodes 8a, 8b, 13a, and 13b contact connection points C, D, J, and K, respectively, and the cathodes thereof contact connection points A, B, H, and I. In this case, since the first and second diodes have polarities reverse to those shown in FIG. 1, the positive voltage and the ground voltage need to be applied in reverse.

Since the first resistors 10 are provided merely in order to adjust the first to seventh control voltages applied to the high-frequency switch 1 from the first to seventh control voltage terminals V1 to V7 through connection points C, D, G, L, M, N, and O, they can be removed as required. In this case, connection points C, D, G, L, M, N, and O can be directly connected to the first to seventh control voltage terminals V1 to V7.

All of the capacitors are used either for blocking DC or for signal coupling. They may be removed as required.

In the above embodiment, the first control voltage terminal V1 is separated from the second control voltage terminal V2. These terminal may be combined into one control voltage terminal.

The third control voltage terminal V3 may be divided into a plurality of control voltage terminals.

A preferred, modified example of the high-frequency switch 1 will be described below.

As shown in FIG. 1 with dotted lines, it may be preferred that first capacitors 20 be connected between the ground and connection points A, B, E, F, H, I, J, and K, respectively. In this case, the characteristic impedance can be compensated for by adjusting the capacitance of the first capacitors 20, and thereby insertion loss and reflection loss caused by the high-frequency switch 1 can be effectively reduced. In addition, the second and the fourth to eighth transmission lines 11a, 11b, 16a, 16b, 18a, and 18b can be made short, and thereby the high-frequency switch 1 can be made compact.

The first capacitors 20 are not necessarily used at all the positions described above. They may be connected only at necessary positions as required.

Figure 2:
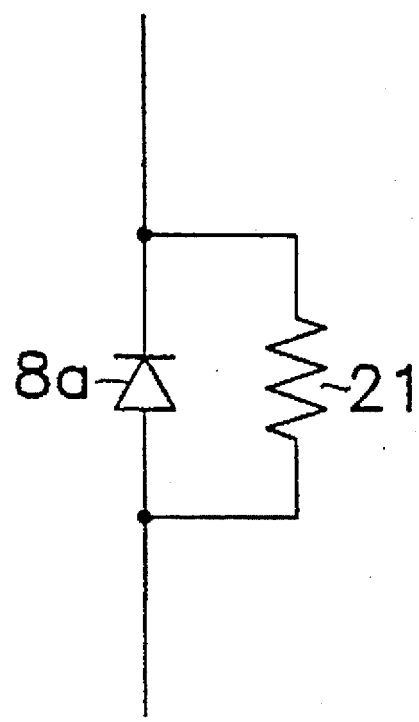
FIG. 2 is a circuit diagram showing a preferred, modified example of the high-frequency switch.
Figure 3:
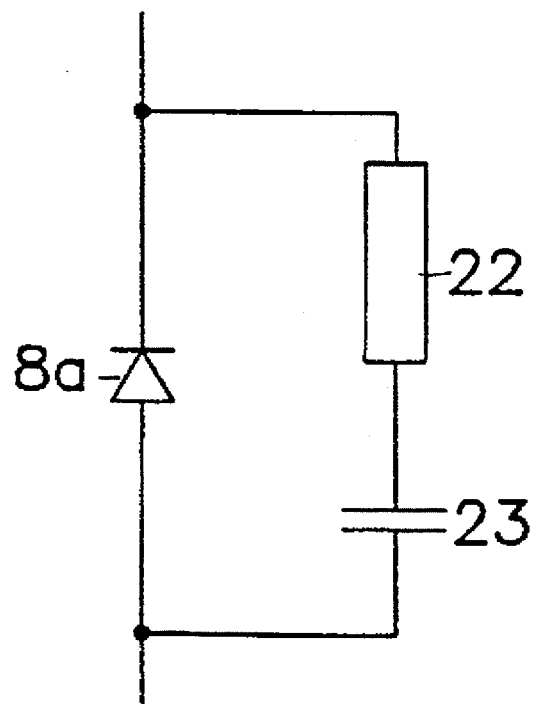
FIG. 3 is a circuit diagram showing another preferred, modified example of the high-frequency switch.
Figure 4:
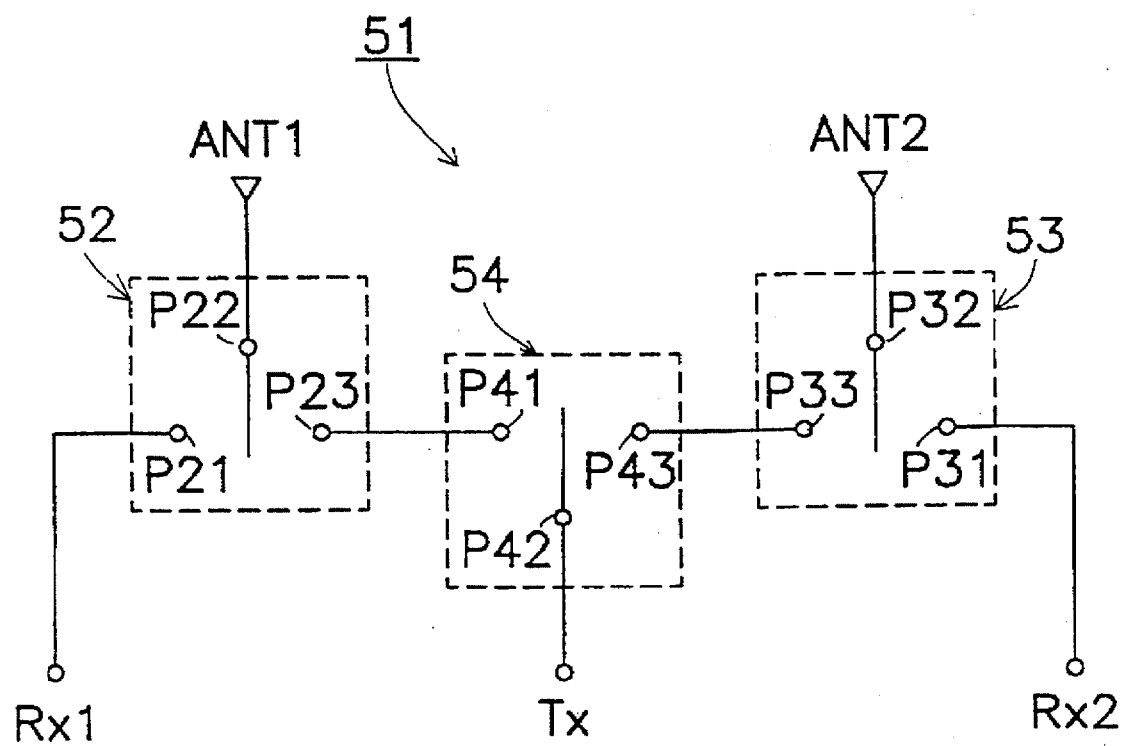
FIG. 4 is a schematic block diagram of a conventional high-frequency switch circuit.

Further preferable, modified examples to be applied to the high-frequency switch of the above-described embodiment will be described below by referring to FIGS. 2 and 3. In the examples shown in FIGS. 2 and 3, at least one circuit element which will be described later is connected to any diode of the first to fourth diodes 8a, 8b, 13a, and 13b. In FIGS. 2 and 3, the first diode 8a is taken as an example among the first to fourth diodes 8a, 8b, 13a, and 13b.

As shown in FIG. 2, a second resistor 21 is connected to the first diode 8a in parallel in the first example. The first diode 8a functions as a capacitor for direct current when it is in the off state. Therefore, charges accumulated when the first diode 8a is in the off state flow immediately when the diode enters the on state. In the configuration shown in FIG. 2, the accumulated charges are discharged through the second resistor 21, and the first diode 8a smoothly switches from the off state to the on state.

In the example shown in FIG. 3, a ninth transmission line 22 and a second capacitor 23 connected in series are connected to the first diode 8a in parallel. With this configuration, a parallel resonant circuit is formed by the capacitor component of the first diode 8a obtained when it is in the off state and the inductor component of the ninth transmission line 22. Therefore, by adjusting the inductance of the ninth transmission line 22 such that the resonant frequency of this parallel resonant circuit matches the frequency of a high-frequency signal to be transmitted, the impedance of the first diode 8a obtained when it is in the off state can be increased. As a result, the isolation characteristics of the first diode 8a obtained when it is in the off state can be improved. The second capacitor 23 is provided in order to prevent a DC current from bypassing the diode through the ninth transmission line 22.

The ninth transmission line 22 can be configured as a stripline, microstripline, coplanar guide line, or the like, and is selected such that the resonant frequency of the parallel resonant circuit matches the frequency of a transmitted or received high-frequency signal.

What is claimed is:

1. A high-frequency switch comprising:
   first to fifth ports;
   a first high-frequency switch circuit for opening and closing the connection between the first port and the third port;
   a second high-frequency switch circuit for opening and closing the connection between the second port and the fourth port; and
   a third high-frequency switch circuit for switching between the connection of the third port and the fifth port and the connection of the fourth port and the fifth port,
   said first high-frequency switch circuit including a first transmission line connected between said first port and said third port, a first diode connected between a reference-voltage point and a connection point between said first port and said first transmission line, a first control voltage terminal connected to a connection point between said first diode and said reference-voltage point, and a second transmission line connected between said reference-voltage point and a connection point between said third port and said first transmission line,
   said second high-frequency switch circuit including a third transmission line connected between said second port and said fourth port, a second diode connected between said reference-voltage point and a connection point between said second port and said third transmission line, a second control voltage terminal connected to a connection point between said second diode and said reference-voltage point, and a fourth transmission line connected between said reference-voltage point and a connection point between said fourth port and said third transmission line,
   and further including a third control voltage terminal connected to a common connection point where one end of said second transmission line of said first high-frequency switch circuit and one end of said fourth transmission line of said second high-frequency switch circuit are connected to said reference-voltage point, and
   said third high-frequency switch circuit including third and fourth diodes connected between said third port and said fifth port and between said fourth port and said fifth port in opposite directions to each other with respect to said fifth port, a fifth transmission line connected between said reference-voltage point and the anode of said third diode, a sixth transmission line connected between said reference-voltage point and the anode of said fourth diode, a fourth control voltage terminal connected to a connection point between said fifth transmission line and said reference-voltage point, a fifth control voltage terminal connected to a connection point between said sixth transmission line and said reference-voltage point, a seventh transmission line connected between the cathode of said third diode and said reference-voltage point, an eighth transmission line connected between the cathode of said fourth diode and said reference-voltage point, a sixth control voltage terminal connected to a connection point between said seventh transmission line and said reference-voltage point, and a seventh control voltage terminal connected to a connection point between said eighth transmission line and said reference-voltage point.

2. A high-frequency switch according to claim 1, wherein at least one of said first to seventh control voltage terminals is connected to the corresponding connection point through a first resistor.

3. A high-frequency switch according to claim 1, wherein at least one of said first to fifth ports is connected to said reference-voltage point through a first capacitor.

4. A high-frequency switch according to one of claim 1, wherein at least one of said first to fourth diodes is provided with a second resistor connected thereto in parallel.

5. A high-frequency switch according to claim 1, wherein at least one of said first to fourth diodes is provided with a ninth transmission line and a second capacitor connected to each other in series and connected in parallel to the diode.

* * * * *